United States Patent
Czaplewski et al.

(10) Patent No.: US 9,827,590 B2
(45) Date of Patent: Nov. 28, 2017

(54) METHOD OF GLASS FABRIC PRODUCTION INCLUDING RESIN ADHESION FOR PRINTED CIRCUIT BOARD FORMATION

(71) Applicant: International Business Machines Corporation, Armonk, NY (US)

(72) Inventors: Sarah K. Czaplewski, Rochester, MN (US); Joseph Kuczynski, North Port, FL (US); Jason Wertz, Pleasant Valley, NY (US); Jing Zhang, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 3 days.

(21) Appl. No.: 14/824,839

(22) Filed: Aug. 12, 2015

(65) Prior Publication Data

US 2016/0368820 A1 Dec. 22, 2016

Related U.S. Application Data

(63) Continuation of application No. 14/742,275, filed on Jun. 17, 2015.

(51) Int. Cl.
*C03C 25/26* (2006.01)
*C03C 25/24* (2006.01)
(Continued)

(52) U.S. Cl.
CPC .......... *B05D 3/002* (2013.01); *C03C 25/1095* (2013.01); *C03C 25/243* (2013.01);
(Continued)

(58) Field of Classification Search
CPC ... C03C 25/101; C03C 25/1095; C03C 25/40; C03C 25/42; D03D 1/0082; D03D 15/0011
See application file for complete search history.

(56) References Cited

U.S. PATENT DOCUMENTS 6,419,981 B1 * 7/2002 Novich ................... C03C 25/00
427/180
6,593,255 B1 * 7/2003 Lawton ................... C03C 25/00
428/372

(Continued)

FOREIGN PATENT DOCUMENTS

EA 200802017 A1 4/2009
JP 5589364 B2 9/2014
WO 2014195271 A1 12/2014

OTHER PUBLICATIONS

Synytska, A., hanum, R., Ionov, L., Cherif, C., Bellmann, C., "Water-repellant Textile via Decorating Fiers with Amphiphilic Janus Particles", Appl. Mater. Interfaces, 2011, 3, 1216-1220.*
(Continued)

*Primary Examiner* — Jason L Lazorcik
(74) *Attorney, Agent, or Firm* — Patterson + Sheridan, LLP

(57) ABSTRACT

Embodiments generally relate to devices and methods for production of fibers and threads for use in electronic device manufacturing. Described here, fibers can be produced and manipulated using a dual-surfaced sizing material. The dual-surfaced sizing material has a surface which binds a fiber and a surface which binds a resin. Thus, the dual-surfaced sizing material can be left attached to the fibers without adversely affecting the resin binding in later production steps.

7 Claims, 5 Drawing Sheets

(51) Int. Cl.

| | | |
|---|---|---|
| *C03C 25/40* | (2006.01) | |
| *C03B 37/02* | (2006.01) | |
| *C03C 25/10* | (2006.01) | |
| *B05D 3/00* | (2006.01) | |
| *D03D 15/00* | (2006.01) | |
| *D03D 1/00* | (2006.01) | |
| *C03C 25/28* | (2006.01) | |
| *H05K 1/03* | (2006.01) | |
| *C09C 1/30* | (2006.01) | |
| *C03B 19/10* | (2006.01) | |

(52) U.S. Cl.
CPC ............ *C03C 25/28* (2013.01); *C03C 25/40* (2013.01); *C09C 1/309* (2013.01); *C09C 1/3072* (2013.01); *C09C 1/3081* (2013.01); *D03D 1/0082* (2013.01); *D03D 15/0011* (2013.01); *H05K 1/0306* (2013.01); *H05K 1/038* (2013.01); *H05K 1/0366* (2013.01); *B05D 2203/35* (2013.01); *C01P 2004/61* (2013.01); *C03B 19/1065* (2013.01)

(56) References Cited

U.S. PATENT DOCUMENTS

| | | | | |
|---|---|---|---|---|
| 6,949,289 | B1* | 9/2005 | Lawton | C03C 25/00 428/372 |
| 7,781,260 | B2 | 8/2010 | Sane et al. | |
| 9,162,398 | B2* | 10/2015 | Thunhorst | |
| 2002/0051882 | A1* | 5/2002 | Lawton | B05C 1/06 428/378 |
| 2002/0055313 | A1* | 5/2002 | Velpari | C03C 25/101 442/180 |
| 2002/0058140 | A1* | 5/2002 | Dana | C03C 25/101 428/375 |
| 2002/0058449 | A1* | 5/2002 | Velpari | B32B 27/12 442/59 |
| 2002/0085888 | A1* | 7/2002 | Velpari | C03C 25/101 408/1 R |
| 2002/0086598 | A1* | 7/2002 | Velpari | C03C 25/101 442/74 |
| 2002/0123285 | A1* | 9/2002 | Dana | C03C 25/101 442/237 |
| 2002/0193027 | A1* | 12/2002 | Dana | B32B 17/02 442/285 |
| 2005/0025967 | A1* | 2/2005 | Lawton | C03C 25/00 428/375 |
| 2008/0160286 | A1* | 7/2008 | Asrar | B29C 45/0005 428/323 |
| 2008/0160302 | A1* | 7/2008 | Asrar | C03C 25/101 428/375 |
| 2008/0234394 | A1* | 9/2008 | Hong | B01J 13/00 516/22 |
| 2009/0065932 | A1 | 3/2009 | Sane et al. | |
| 2009/0076198 | A1 | 3/2009 | Giesenberg et al. | |
| 2010/0249306 | A1 | 9/2010 | Berndt et al. | |
| 2011/0028308 | A1* | 2/2011 | Shah | C03B 37/0206 502/159 |
| 2013/0045373 | A1* | 2/2013 | Adachi | B29B 15/08 428/219 |
| 2014/0061902 | A1 | 3/2014 | Ramalingam et al. | |
| 2014/0370313 | A1 | 12/2014 | Thomas et al. | |
| 2015/0140312 | A1* | 5/2015 | Carter | D06M 13/516 428/221 |
| 2015/0275420 | A1* | 10/2015 | Tamura | D06M 11/79 442/59 |
| 2015/0291742 | A1* | 10/2015 | Lee | C08F 8/00 524/577 |
| 2016/0114325 | A1* | 4/2016 | Tang | B01L 3/502761 435/32 |

OTHER PUBLICATIONS

Stober et al., "Controlled Growth of Monodisperse Silica Spheres in the Micron Size Range," Journal of Colloid and Interface Science 26, 1968, pp. 62-69.

Giermanska-Kahn et al., "Particle-Stabilized Emulsions Comprised of Solid Droplets," Langmuir 2005, 21, pp. 4316-4323.

Perro et al., "Production of large quantities of "Janus" nanoparticles using wax-in-water emulsions," Colloids and Surfaces A: Physicochem. Eng. Aspects 332 (2009, pp. 57-62.

International Business Machines Corporation, "List of IBM Patents or Patent Applications Treated as Related," Aug. 12, 2015, 2 pages.

* cited by examiner

METHOD OF GLASS FABRIC PRODUCTION INCLUDING RESIN ADHESION FOR PRINTED CIRCUIT BOARD FORMATION

This application is a continuation of co-pending U.S. patent application Ser. No. 14/742,275, filed Jun. 17, 2015. The aforementioned related patent application is herein incorporated by reference in its entirety.

BACKGROUND

Embodiments described herein generally relate to the production of glass cloth for use in printed circuit boards.

Printed circuit boards are typically formed from laminated layers of fabric composed of reinforcing fibers, such as glass fibers. The reinforcing fibers provide dimensional stability to the board to maintain the integrity of the electronic circuits mounted thereon. Holes are formed in the board by drilling through the layers of the laminate or support to interconnect circuits through different planes.

Manufacturing of glass fibers that are used in printed circuit boards require many steps prior to the use of the fabric within laminates. In the first step, molten glass is extruded through holes to produce the glass fibers. Next, the fibers pass through a zone where a sizing material, such as a starch-oil emulsion, is added to the individual fibers. The sizing material is needed as it protects the fibers from abrasion and prevents surface defects. Then, the fibers are formed together to create strands of glass fiber that is then wound onto spools. After spooling, the strands are then woven to generate the glass cloth.

In the case of composites or laminates formed from fiber strands woven into fabrics, in addition to providing good wet-through and good wet-out properties of the strands, the surfaces of the fiber strands are then coated to protect the fibers from abrasion during processing, provide for good weavability, particularly on air-jet looms and preventing damage to the fibers during the weaving process. However, many sizing components are not compatible with the resin and can adversely affect adhesion between the glass fibers and the polymeric matrix material. For example, the starch-oil emulsion, which is a commonly used sizing component for glass fibers, is generally not compatible with resin. As a result, these incompatible materials must be removed from the fabric prior to impregnation with the resin.

The removal of such non-resin compatible sizing materials (also referred to as de-greasing or de-oiling the fabric) can be accomplished through a variety of techniques. The removal of these non-resin compatible sizing materials is most commonly accomplished by exposing the woven fabric to elevated temperatures for extended periods of time to thermally decompose the sizing materials (commonly referred to as "heat-cleaning"). A conventional heat-cleaning process involves heating the fabric at 380° C. for 60-80 hours. However, such heat cleaning steps are detrimental to the strength of the glass fibers, are not always completely successful in removing the incompatible materials and can further contaminate the fabric with sizing decomposition products. Other methods of removing sizing materials are available, such as water washing and/or chemical removal. However, such methods generally require significant reformulation of the sizing compositions for compatibility with such water washing and/or chemical removal operations and are generally not as effective as heat-cleaning in removing all the incompatible sizing materials. Further, heat-cleaning, water washing or chemical removal operations all add to the cost of production as well as the time expenditure.

After weaving, the fabric must be modified to allow the cloth to bond with the resin used in the lamination step to produce printed circuit boards. A silane modifier is used to treat the fabric. On one end of the silane modifier is a functionality for bonding the fibers within the fabric. On the other end of the silane modifier is a functionality for bonding to the resin material. This enhances the adhesion between the cloth and the resin. The now treated glass cloth can be impregnated with resin and then used to form the laminate.

As such, there is a continuing need in the art for methods and systems for glass fiber printed circuit board manufacture which reduce cost of production while maintaining or increasing resulting quality.

SUMMARY

Embodiments described herein generally relate to devices and methods for creating a dual surfaced sizing material and uses for the same. In one embodiment, an electronic device material can include a plurality of fibers comprising glass, the fibers having a sizing material on at least a portion of a surface of at least one of said fibers, the sizing material comprising: a silicon-containing core having a first exposed region and a second exposed region, the first exposed region having a resin binding functionalizing material and the second exposed region having a silanizing material, the first exposed region having an anisotropic surface chemistry as compared to the second exposed region.

In another embodiment, a method of producing an electronic device material includes extruding a plurality of fibers, the fibers comprising glass; coating at least a portion of a surface of the fibers with a sizing material, the sizing material having an anisotropic surface chemistry on a first exposed region and a second exposed region, the first exposed region interacting with the portion of the surface of the at least one of said fibers; and forming the plurality of fibers into a plurality of strands.

In another embodiment, a method of producing a sizing material, includes forming a silicon-containing core; exposing the silicon-containing core to a surfactant; embedding the silicon-containing core in a lipophilic component of an emulsion, the silicon-containing core having a first surface and a second surface, the silicon-containing core being embedded such that the first surface is exposed and the second surface is obstructed by the lipophilic component; washing the first surface to create a clean first surface; exposing the clean first surface to a resin-binding functionalizing material; removing the lipophilic component to expose the second surface; and exposing the second surface to a silanizing agent.

BRIEF DESCRIPTION OF THE SEVERAL VIEWS OF THE DRAWINGS

So that the manner in which the above recited features of the present devices, systems and methods can be understood in detail, a more particular description of the devices, systems and methods, briefly summarized above, may be had by reference to embodiments, some of which are illustrated in the appended drawings. It is to be noted, however, that the appended drawings illustrate only typical embodiments and are therefore not to be considered limiting of its scope, for the devices, systems and methods may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally relate to devices and methods for creating a dual surfaced sizing material and uses for the same. The fibers are coated with a sizing material having two surfaces, one surface having a binding affinity for a resin and the other surface having a binding affinity for the fiber. Because the sizing material does not negatively affect the resin binding to the fibers, the fibers can be converted to threads, woven into fabrics and otherwise processed without removal of the sizing material. Thus, the resulting circuit board substrate can be created with lower energy input, fewer steps and shorter time to completion than devices made using other methods.

Figure 1:
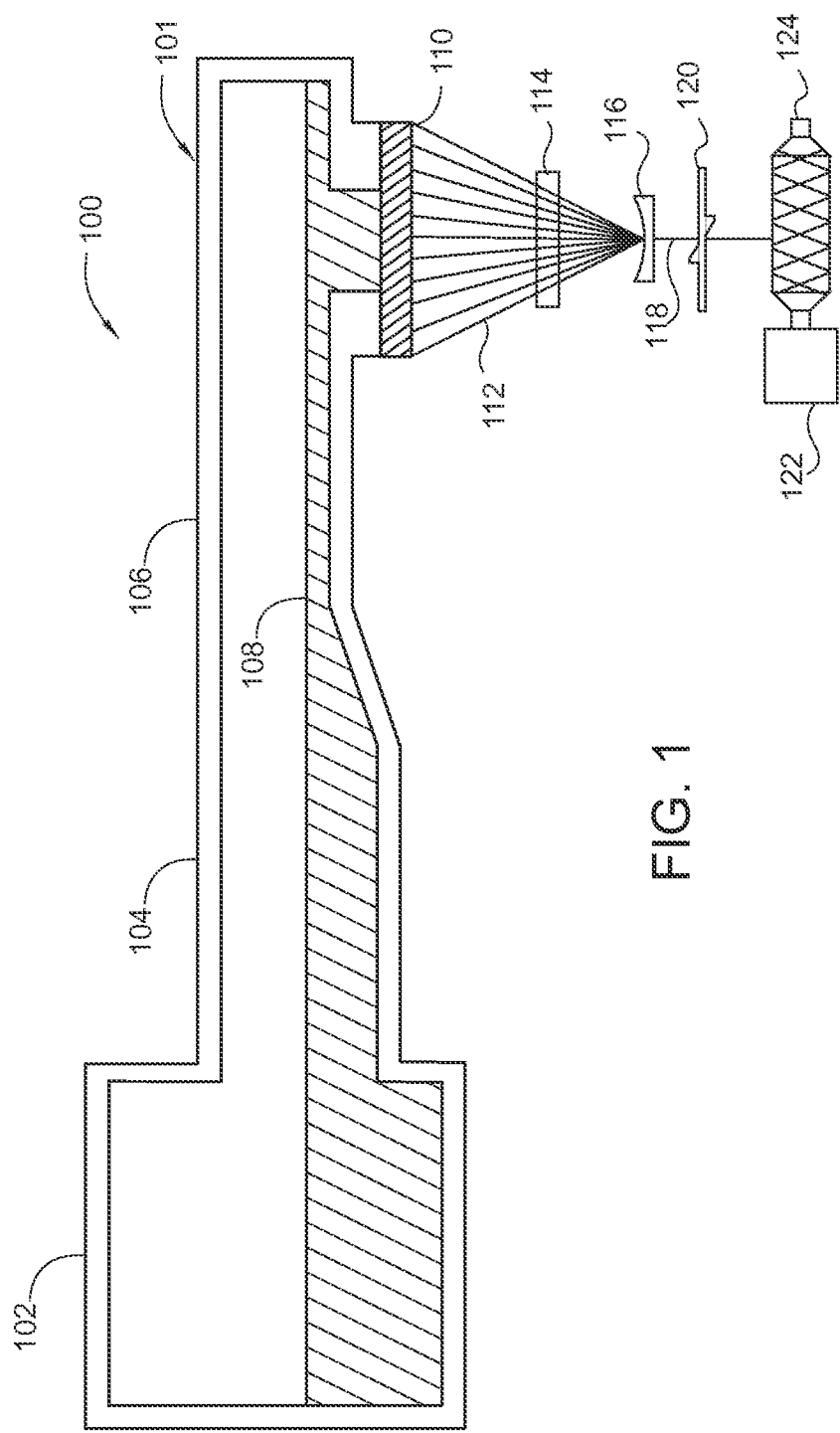
FIG. 1 is a schematic of a forming apparatus, such as is used in glass fiber extrusion.

FIG. 1 depicts a schematic of a forming apparatus 100, such as is used in glass fiber extrusion. The forming apparatus includes a furnace 101, one or more bushings 110, one or more applicators 114, one or more gathering shoes 116, one or more spirals 120 and one or more take-up devices, shown here as a winder 122 with a collet 124.

Prior to being extruded as glass fibers, the batch ingredients (e.g., glass) undergo a batch mixing and melting process. The batch mixing and melting process begins with the weighing and blending of the batch ingredients. The individual components of the batch ingredients are weighed and delivered to a blending station (not shown). The blending station thoroughly mixes the batch ingredients before the ingredients are transported to a furnace 101.

The furnace 101 is generally divided into three distinct sections, a furnace section 102, a refiner section 104 and a forehearth 106. The batch ingredients are first delivered into the furnace section 102 for melting the batch ingredients. The furnace section 102 melts the batch ingredients into a molten glass 108. In one example, the furnace section 102 can be maintained at between 1500 degrees Celsius and 1600 degrees Celsius, to create a molten glass temperature of about 1370 degrees Celsius. The melting process also includes the removal of gaseous inclusions and homogenization of the molten glass 108. Then, the molten glass 108 flows into the refiner section 104. The temperature of the glass in the refiner section 104 is lowered, such as from the above example of about 1370 degrees Celsius to about 1260 degrees Celsius. The molten glass 108 next goes to the forehearth 106 located directly above the fiber-forming stations. The temperatures throughout this process are prescribed by the viscosity characteristics of the particular glass. In addition, the physical layout of the furnace can vary widely, depending on the space constraints.

The conversion of molten glass 108 in the forehearth 106 into continuous glass fibers is an attenuation process. In the attenuation process as described herein, a larger flow of glass is reduced to a much smaller flow by attenuating the flow, which upon cooling becomes single strands. The molten glass 108 flows through a bushing 110, such as a platinum-rhodium alloy bushing. The bushing 110 has a large number of holes or tips. Eleven (11) holes or tips are shown in FIG. 1, corresponding to eleven (11) fibers 112. In one embodiment, a bushing 110 can have between about 400 and about 8000 holes or tips. The bushing 110 can be heated electrically. Further, the heat of the bushing 110 can be controlled very precisely to maintain a constant glass viscosity. The fibers 112 are drawn down and cooled rapidly as they exit the bushing 110.

A sizing is then applied to the surface of the fibers by passing the fibers over an applicator 114 that continually rotates through a sizing bath to maintain a thin film through which the fibers 112 pass. As used herein, the terms "size", "sized" or "sizing" refer to the aqueous composition applied to the fibers 112 immediately after formation. A sizing bath is a container which holds the sizing. The sizing compositions described herein can include as components, among other constituents, film-formers, lubricants, coupling agents, emulsifiers and water.

The fibers 112 can be formed from any type of fiberizable glass composition known to those skilled in the art including those prepared from fiberizable glass compositions such as "E-glass", "A-glass", "C-glass", "D-glass", "R-glass", "S-glass" and E-glass derivatives. In one example, glass fibers are formed from E-glass and E-glass derivatives. The fibers 112 can have a nominal filament diameter ranging from about 5.0 to about 35.0 micrometers.

After applying the sizing material, the fibers 112 are gathered, or consolidated according to the natural filament split, into strands 118 using a gathering shoe 116, before approaching the take-up device 122. The gathering shoe 116 gathers selected groups of the fibers 112 to form one or more strands 118. The strands 118 typically have about 100 to about 15,000 fibers per strand, such as about 200 to about 7,000 fibers. The strands 118 can be drawn through the gathering 116 at speeds of about 2,500 feet per minute to about 18,000 feet per minute. Although not intended to be limiting, the gathering shoe 116 shown in FIG. 1, forms one strand 118, but it should be appreciated that fibers 112 may be divided into more strands 118, such as between 1 to about 20 strands. Strands 118 can also be formed from fibers 112 drawn from a plurality of adjacent bushings 110 (not shown).

The forming apparatus 100 also includes spiral 120. The spiral 120 traverses the strands 118 along the length of the axis of rotation of the rotatable collet 124 of the winder 122. The spiral 120 thus maintains proper coiling of the strands 118 during winding of the strands 118 about the surface of the collet 124.

Figure 2:
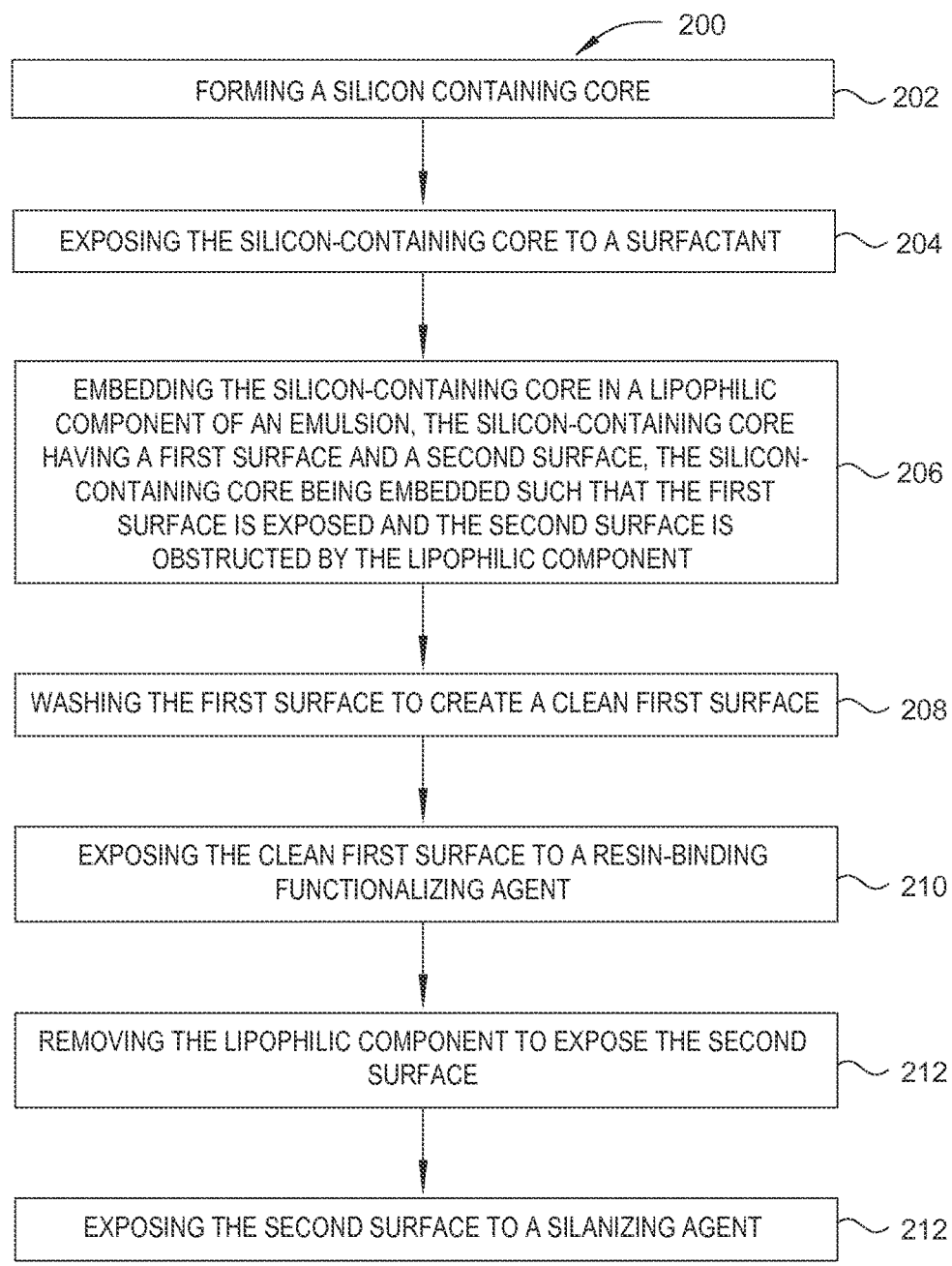
FIG. 2 is a flow diagram of a method of forming a sizing material, according to one embodiment.

FIG. 2 depicts a method 200 of forming a sizing material, according to one embodiment. FIGS. 3A-3H depict a sizing material 300, an emulsion 320 and a sized fiber 350, as formed using the method 200 of FIG. 2. The method 200 can include or sequentially include forming a silicon-containing core, at 202; exposing the silicon-containing core to a surfactant, at 204; embedding the silicon-containing core in a lipophilic component of an emulsion, the silicon-containing core having a first surface and a second surface, the silicon-containing core being embedded such that the first surface is exposed and the second surface is obstructed by the lipophilic component, at 206; washing the first surface to create a clean first surface, at 208; exposing the clean first surface to a resin-binding functionalizing material, at 210; removing the lipophilic component to expose the second surface, at 212; and exposing the second surface to a silanizing agent, at 214.

The sizing material formed by embodiments described herein includes dual-surfaced particles. Each dual-surfaced particle has a silane coupling agent on one side of the particle (i.e., a first binding surface) and an organic functionality on the other side of the particle (i.e., a second binding surface). The silane coupling agent can bond to the glass fibers during the forming process. The organic functionality that can bond to the resin used in the laminate. By having a first binding surface and a second binding surface, the sizing material does not need to be removed before resin binding. Thus, the dual-surfaced particle allows for the elimination of processing steps needed to form the substrate, such as a circuit board substrate, and promotes adhesion between the fibers and the resin.

The method 200 for forming a sizing material 300 begins at 202 with forming a silicon-containing core 302. The silicon-containing core 302 can be produced in the micron to nano size range, such as less than 1 micrometer (μm). The silicon-containing core 302 can be produced using a silica precursor, such as tetraethoxysilane (TEOS). TEOS can then be added to an excess of water containing a low molar-mass alcohol, such as ethanol, and containing ammonia. The process is believed to take place via monomer addition, in which nucleation occurs quickly and is followed by a particle growth process without further nucleation. However, this understanding is not intended to be limiting of possible embodiments.

The diameter of silica particles from the Stöber process is controlled by the relative contribution from nucleation and growth processes. The hydrolysis and condensation reactions provide precursor species and the necessary supersaturation for the formation of particles. During the hydrolysis reaction, the ethoxy group of TEOS reacts with the water molecule to form the intermediate $[Si(OC_2H_5)_{4-x}(OH)_x]$ with hydroxyl group substituting ethoxy groups. Ammonia works as a basic catalyst to this reaction; the hydrolysis reaction is initiated by the attacks of hydroxyl anions on TEOS molecules. The chemical reaction is expressed as follows:

$$Si(OC_2H_5)_4 + xH_2O \rightarrow Si(OC_2H_5)_{4-x}(OH)_x + xC_2H_5OH$$

Following the hydrolysis reaction, the condensation reaction occurs immediately. Where the hydroxyl group of intermediate $[Si(OC2H5)_{4-x}(OH)_x]$ reacts with either the ethoxy group of other TEOS "alcohol condensation" or the hydroxyl group of another hydrolysis intermediate "water condensation" to form Si—O—Si bridges. The rate of water condensation is believed to be about thousands of times faster than the alcohol condensation. The overall reaction is expressed as follows:

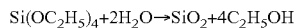

$$Si(OC_2H_5)_4 + 2H_2O \rightarrow SiO_2 + 4C_2H_5OH$$

The resulting suspension is then stirred or otherwise agitated. The resulting silicon-containing core 302 can have diameters between 50 and 2000 nanometers. The diameter of the resulting silicon-containing core 302 can be modified by changing type of silicate ester used, type of alcohol used and volume ratios. Silicate esters may generally include esters of orthosilicic acid. Silicate esters which may be used with embodiments described herein include tetraethyl orthosilicate, tetramethyl orthosilicate, tetraphenyl orthosilicate, combinations thereof and others. Alcohols may generally include organic molecules having an OH group, such as alcohols that form an homologous series with the general formula $C_nH_{2n+1}OH$. Alcohols which may be used with embodiments described herein include methanol, ethanol, n-propanol, n-butanol, combinations thereof and others. In one embodiment, the concentrations for the resulting suspension include 0.1M to 0.5M TEOS, 0.5M to 17.0M $H_2O$ and 0.5M-3M $NH_3$ with the solvent in excess.

Using the above example, the reactions taking place are hydrolysis of the silyl ether to a silanol. The silanol is then condensed to silica by a condensation reaction.

The silicon-containing core 302 can be exposed to a surfactant 304, at 204. As described here, the silicon-containing core 302 is dispersed in an aqueous suspension, to which the surfactant 304 is added. The hydrophilic surface of the silicon-containing core 302 is made partially hydrophobic by adsorbing the surfactant 304. The surfactant 304 may be an anionic or cationic surfactant. In one embodiment, a cationic surfactant, such as cetyl trimethylammonium bromide (CTAB), may be used to hydrophobize the surfaces of the silicon-containing core 302. Other surfactants 304 which may be used with embodiments described herein include sodium dodecyl sulfate (SDS) and sodium lauryl sulfate (SLS).

Since the silicon-containing core 302 is intrinsically hydrophilic, the surface is partially hydrophobized in order to favor particle adsorption at the oil/water interface. To achieve this, the surfactant 304 is employed at a very low concentration, such as below $1 \times 10^{-3}$ mol/L for CTAB. The surfactant 304 is then partially adsorbed on the surface of the silicon-containing core 302. The surfactant 304 can be selected to obtain the strongest anchoring of the molecules on the silicon-containing core 302 surfaces.

Without intending to be bound by theory, it is believed that the emulsions are rapidly destabilized if the concentration of surfactant 304 initially introduced is above its critical micellar concentration (cmc), which is approximately $9 \times 10^{-4}$ mol/L for CTAB. It is well-known that molecules such as CTAB form bilayers at the silica/water surface when the free surfactant concentration in the aqueous phase exceeds 1 cmc. The polar heads of the external layers are oriented toward the water phase, and the silica surface remains hydrophilic. Under such conditions, the solid particles do not adsorb on the emulsion droplets and the behavior is the same as that for surfactant-stabilized emulsions. As such, a low concentration of the surfactant 304 or other surfactant is used to avoid the creation of a bilayer at the surface of the particles. In one embodiment, the silicon-containing core 302 is exposed to the surfactant 304 at a ratio of surfactant 304 to silicon-containing core 302 of from about $5 \times 10^{-6}$ mol $L^{-1} m^{-2}$ to about $2.5 \times 10^{-6}$ mol $L^{-1} m^{-2}$.

Figure 3A:
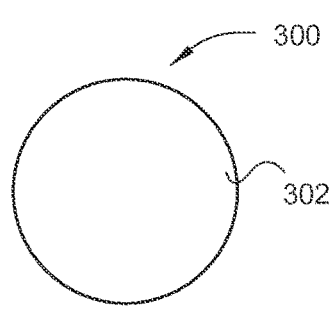
FIGS. 3A-3H depict the formation of the sizing material, as described in FIG. 2.
Figure 3B:
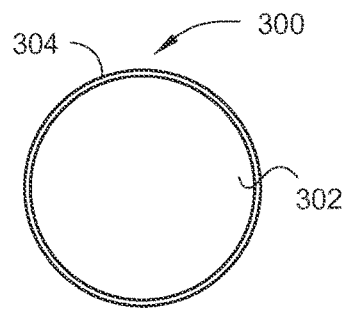
Figure 3C:
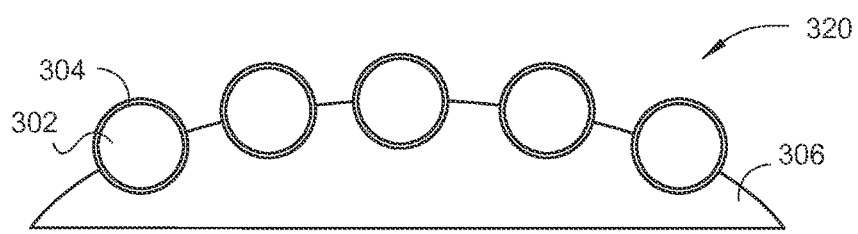

The silicon-containing core, having a first surface and a second surface, can then be embedded in a lipophilic component of an emulsion, the silicon-containing core being embedded such that the first surface is exposed and the second surface is obstructed by the lipophilic component, at 206. The surfactant 304 and the partial hydrophobicity it provides, helps promote anchoring of the silicon-containing core 302 at the oil/water interface. A wax 306 or other lipophilic component can then be added to the suspension. In one example, the wax 306 added to the suspension is paraffin wax. The suspension is heated or maintained at a temperature which will melt the wax 306. Once the wax 306 has melted, the suspension can then be agitated to assure complete mixture of the silicon-containing core 302 and the wax 306. In one embodiment, the suspension is vigorously stirred at between 6,000 rpm and 10,000 rpm for a period of time, such as between about 30 s and about 90 s. The emulsion is then allowed to cool to a temperature such that the wax solidifies, for example to room temperature. The droplets of wax 306 with the embedded silicon-containing cores 302 are shown in FIG. 3C.

Figure 3D:
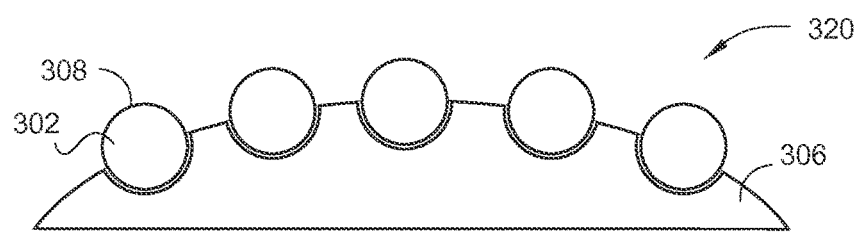
Figure 3E:
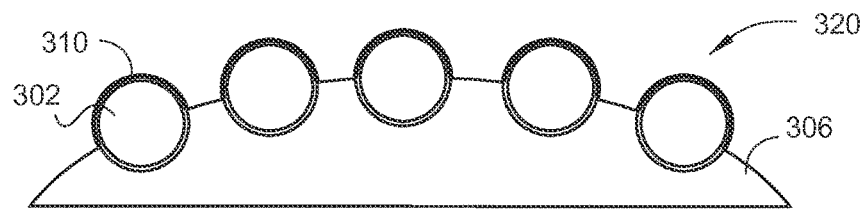
Figure 3F:
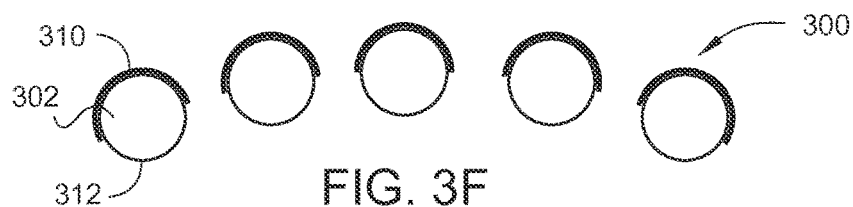
Figure 3G:
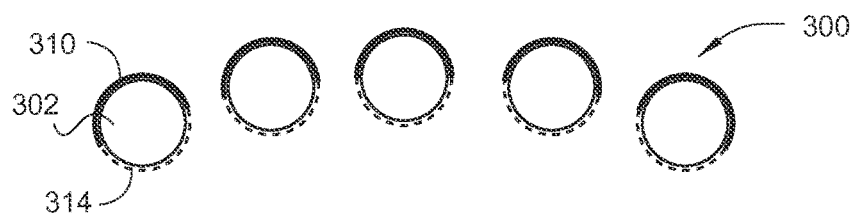
Figure 3H:
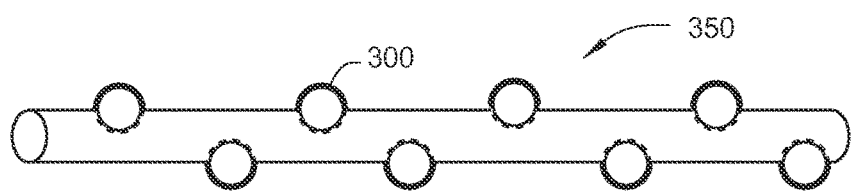

The first surface 308 is then washed to create a clean first surface, at 208. The boundary of the first surface 308 is defined by the portion of the silicon-containing core 302 that is embedded in the wax 306. The silicon-containing core 302 will still have a portion of the surfactant 304 formed on the first surface 308. As such, the first surface 308 can be washed using an acid. In one embodiment, the wax 306 with the silicon-containing core 302 is then filtered and washed using hydrochloric acid (HCl). After the wash, the silicon-containing cores 302 have an exposed first surface 308 while remaining embedded in the wax 306, as shown in FIG. 3D.

The clean first surface 308 is then exposed to a resin-binding functionalizing material 310, at 210. The resin-binding functionalizing material enables the sizing material 300 to attach to the resin. The resin binding functionalizing material 310 is a molecule which binds to the silicon-containing core 302 and creates a surface on the silicon-containing core 302 which can bind a resin. The resin binding functionalizing material 310 provides an anisotropic surface chemistry on the silicon-containing core 302. For the surface modification of the particle, the wax 306 with embedded silicon-containing cores 302 can be reacted in their original suspension with the resin binding functionalizing material 310. The resin binding functionalizing material 310 can include functional groups such as vinyls, amines, epoxies, allyls, and acrylates. In one embodiment, the resin binding functionalizing material 310 is vinyl chloride.

The lipophilic component can then be removed to expose the second surface, at 212. After attaching the resin binding functionalizing material 310, the silicon-containing core 302 is removed from the wax 306 to expose the second surface 312. To remove the wax 306, a solvent, such as a hydrocarbon solvent, can be used. In one embodiment, the solvent is benzene. The silicon-containing core 302 is then centrifuged and decanted one or more times to yield silicon-containing core 302 free of the wax 306.

Then, the second surface can be exposed to a silanizing agent 314, at 214. The silanizing agent 314 is an organo-functional alkoxysilane molecule, such as chlorotriethoxysilane. In order to attach the silicon-containing core 302 to the fibers 112, the silicon-containing core 302 must be functionalized. This functionalization is done by reacting silanizing agent 314 with the exposed particle surface (e.g., the second surface 312). In this embodiment, the reaction of the silicon-containing core 302 with the silanizing agent 314 functionalizes the second surface 312 leaving the ethoxy-functionalities available for reaction to the glass fibers. Since the resin binding functionalizing material 310 is bound to the first surface 308 and does not have an exposed OH group, the first surface 308 cannot react with the silanizing agent 314.

The resulting sizing material 300 (also referred to as the dual-surfaced particle) has two functional regions capable of binding both the resin (e.g., the resin binding functionalizing material 310) and the fiber 112 (e.g., the silanizing agent 314). By creating two functional domains for the sizing material 300, the sizing material 300 does not need to be removed after the fibers 112 are extruded. This saves both processing time and reduces the number of steps involved in the creation of fiber based products, such as printed circuit boards (PCB).

Figure 4:
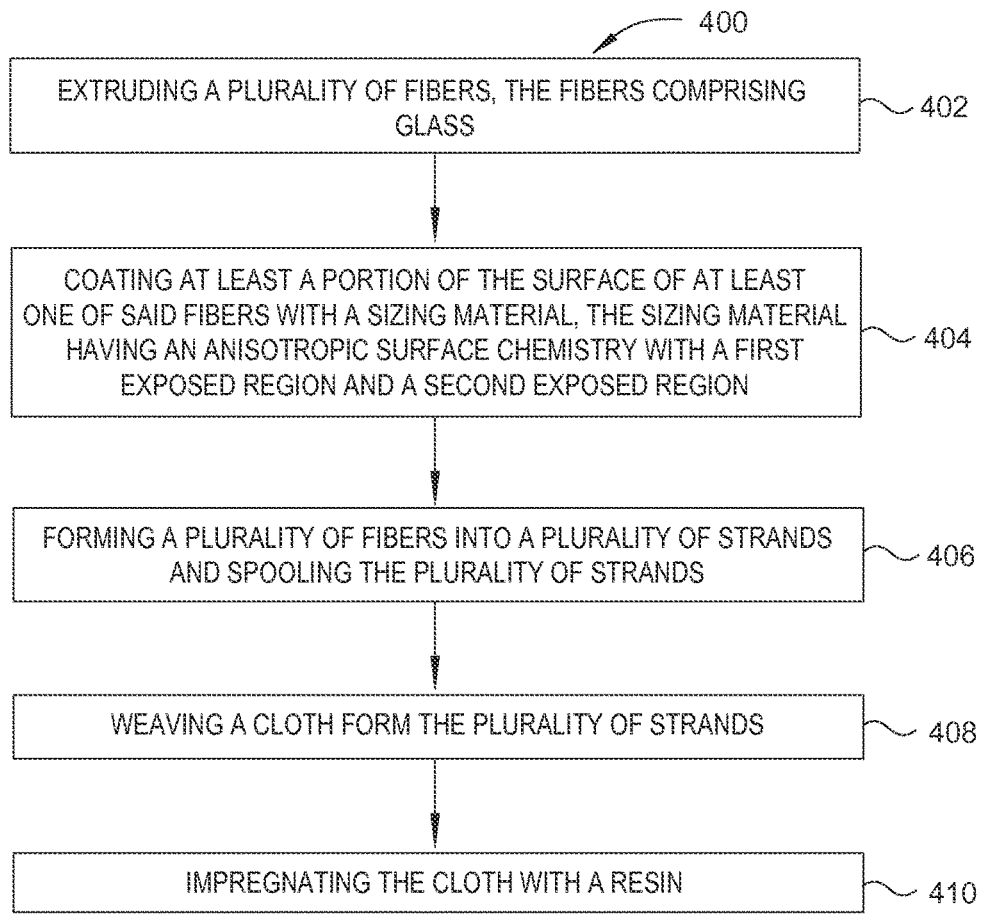
FIG. 4 is a flow diagram of a method of forming a board, according to one embodiment.

FIG. 4 depicts a method 400 of forming a board, according to one embodiment. The method 400 includes extruding a plurality of glass fibers, at 402; coating at least a portion of a surfaces of the glass fibers with a sizing material, the sizing material having an anisotropic surface chemistry with a first exposed region and a second exposed region, the first exposed region interacting with the fibers, at 404; forming the plurality of fibers into a plurality of strands, and spooling the plurality of strands, at 406; weaving a cloth from the plurality of strands, at 408; and impregnation of the cloth with a resin, at 410.

The method 400 begins with extruding a plurality of glass fibers, at 402. The plurality of fibers are extruded in a substantially similar manner as described with reference to the fibers 112 of FIG. 1. The fibers can comprise glass, such as fibers made substantially of glass.

At least a portion of a surface of the fibers can be coated with a dual-surfaced particle, at 404. The dual-surfaced particles have an anisotropic surface chemistry between a first exposed region and a second exposed region. The dual-surfaced particle can be substantially similar to the sizing material 300 described with reference to FIGS. 3A-3H. The first exposed region interacts with the portion of the surface of the at least one of said fibers. The second exposed region is silanized, as described with reference to FIG. 2 and FIGS. 3A-3H.

The plurality of fibers can then be formed into a plurality of strands and spooled, at 406. The formation of the strands and spooling of said strands is substantially similar to the formation and spooling process generally described with reference to FIG. 1.

A cloth can then be weaved from the plurality of strands, at 408. The cloth can be formed by weaving the above described strands. The plurality of strands may be used as the warp or portions thereof, the filling or portions thereof, or any combinations thereof. Thus, non-sized strands can be used as the warp, the filling, or any portion thereof, in conjunction with the plurality of strands such that a cloth can be made. The plurality of strands including the dual-surfaced particles described above can provide protection to and from the non-sized strands.

After weaving, the cloth can be impregnated with a resin, at 410. The dual-surfaced particles all have a substantially similar orientation, based on the binding of the silanizing material to the fibers of the strand. Thus, the dual-surfaced particle is oriented such that the resin binding functionalizing material is facing outward from the strand. The cloth, made using said strands, is then impregnated with the resin, such as by immersion, spray or other delivery methods. The resin used may be a resin for use in the formation of fiberglass boards for PCBs. One such resin is an epoxy resin. Once impregnated with resin, the cloth and resin composite may be pressurize and cured creating a laminate.

In this embodiment, the fibers are coated with a sizing material as described above. The sizing material allows for binding and protection of the fibers during the extrusion and weaving processes, without negatively affecting the binding of the resin. Therefore, removal of the sizing material prior to impregnation is necessary. Using embodiments described here, the resulting device can be created with lower energy input, fewer steps and shorter time to completion than devices made using other methods.

EXAMPLE

In one embodiment, the silicon-containing cores of the sizing material were prepared through a modified Stöber synthesis using anhydrous ethanol (200 proof), ammonia (2M), deionized water, and tetraethoxysilane (TEOS). (Stöber et al., Journal of Colloid and Interface Science, Vol. 26, pg. 62-69 (1968)) Ethanol (6 mL) and TEOS (1 mL) were added together and shaken to mix, creating a monomer solution. In a separate vial, 2M ammonia (4 mL) and deionized water (1 mL) were added and shaken to mix, creating an ammoniacal solution. The ammoniacal solution was then poured into the monomer solution and then left to react. After reaction period, particles were centrifuged and rinsed with ethanol to remove residual monomer yielding silica nanoparticles.

Sizing material with resin bonding functionality was prepared using a paraffin-in-water emulsion. Silicon-containing cores were dispersed in an ethanol/water solution and heated to 65° C. creating a suspension. Cetyl trimethylammonium bromide (CTAB) was then added to the suspension, followed by paraffin wax (1 g) being deposited on top of the suspension. Once the wax was melted, the mixture was vigorously stirred (9000 rpm) for 80 s. The emulsion was then allowed to cool to room temperature allowing for the droplets of paraffin wax with embedded silica particles to solidify. The solid paraffin wax droplets were then filtered and dispersed into toluene (20 mL) and stirred. Next, vinyl chloride (0.1-10 wt %) was added and the mixture is heated to 35° C. The mixture was allowed to react for 48 h followed by filtration and washing of the wax droplets with ethanol. Finally, the paraffin droplets were dissolved in dichloromethane (DCM) to produce sizing material with resin-bonding functionality.

To prepare the dual surfaced particle, toluene (20 mL) was added to a separate flask and was stirred. To the toluene, 1 g of the sizing material with resin bonding functionality was added, followed by the dropwise addition of chlorotriethyoxysilane (0.1-10 wt %). The particle mixture was then allowed to react for 24 h at 35° C. After reaction, the mixture was cooled to room temperature and then filtered and washed with ethanol. The final product was then dried under a vacuum.

Molten glass was extruded into individual fibers. The fibers were then sprayed or dipped into a solution containing the dual-surfaced particle (0.1-10 wt %, ethanol, and acetic acid). After treatment of the glass fibers, the fibers were then dried. Next, the finished "particle sized" fibers were formed then into strands (or yarn). The strands were then woven into glass cloth. Since the "particle sizing material" has the organic functionalities (i.e., epoxies, amines, vinyls, allyls, acrylates) already attached, the newly formed glass cloth can be impregnated with resin and then used for laminates.

Embodiments described herein relate to devices, systems and methods for the formation of fibers using a sizing material comprising a dual-surfaced particle. The fibers are coated with a sizing material and the dual-surfaced particles bind to the fibers as described above. From here, the fibers can be converted to threads, woven into fabrics and otherwise processed without removal of the sizing material. Since the sizing material allows for binding and protection of the fibers without negatively affecting the binding of the resin, no removal step is necessary. Thus, the resulting circuit board substrate can be created with lower energy input, fewer steps and shorter time to completion than circuit board substrates made using other methods.

While the foregoing is directed to embodiments of the present devices, systems and methods, other and further embodiments of the devices, systems and methods may be devised without departing from the basic scope thereof, and the scope thereof is determined by the claims that follow.

What is claimed is:

1. A method of producing a sizing material, sequentially comprising:
    forming a silicon-containing core;
    exposing the silicon-containing core to a surfactant;
    embedding the silicon-containing core in a lipophilic component of an emulsion, the silicon-containing core having a first surface and a second surface, the silicon-containing core being embedded such that the first surface is exposed and the second surface is obstructed by the lipophilic component;
    washing the first surface to create a clean first surface;
    exposing the clean first surface to a vinyl chloride resin-binding functionalizing material;
    removing the lipophilic component to expose the second surface; and
    exposing the second surface to chlorotriethoxysilane.

2. The method of claim 1, wherein the silicon-containing core is exposed to the surfactant at a ratio of surfactant to silicon-containing of from about $5 \times 10^{-6}$ to about $2.5 \times 10^{-6}$ mol $L^{-1} m^{-2}$.

3. A method of producing a material, comprising:
    producing a sizing material by a process comprising:
        forming a silicon-containing core having a first surface and a second surface;
        exposing the first surface to a resin-binding functionalizing material selected from the group consisting of vinyls, amines, epoxies, allyls, and acrylates;
        exposing the second surface to a silanizing agent to form a sizing material having an anisotropic surface chemistry between a first region of the sizing material and a second region of the sizing material;
    extruding a plurality of fibers, the fibers comprising glass; and
    coating at least a portion of a surface of at least one of said fibers with the sizing material, wherein the first region interacts with the portion of the surface of the at least one of said fibers; and
    forming the plurality of fibers into a plurality of strands.

4. The method of claim 3, further comprising:
    spooling the plurality of strands; and
    weaving a cloth from the plurality of strands.

5. The method of claim 4, further comprising impregnating the cloth with a resin.

6. The method of claim 5, wherein the second region interacts with the resin.

7. A method of producing a sizing material, sequentially comprising:
    forming a silicon-containing core;
    exposing the silicon-containing core to a surfactant;
    embedding the silicon-containing core in a lipophilic component of an emulsion, the silicon-containing core having a first surface and a second surface, the silicon-containing core being embedded such that the first surface is exposed and the second surface is obstructed by the lipophilic component;
    washing the first surface to create a clean first surface;
    exposing the clean first surface to a vinyl chloride resin-binding functionalizing material;
    removing the lipophilic component using a hydrocarbon solvent to expose the second surface; and
    exposing the second surface to chlorotriethoxysilane.

* * * * *